(12) United States Patent
Ueki et al.

(10) Patent No.: US 11,351,631 B2
(45) Date of Patent: Jun. 7, 2022

(54) LASER PROCESSING APPARATUS WITH CALCULATING SECTION

(71) Applicant: DISCO CORPORATION, Tokyo (JP)

(72) Inventors: Atsushi Ueki, Tokyo (JP); Yutaka Kobayashi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 247 days.

(21) Appl. No.: 16/910,655

(22) Filed: Jun. 24, 2020

(65) Prior Publication Data

US 2021/0008661 A1 Jan. 14, 2021

(30) Foreign Application Priority Data

Jul. 9, 2019 (JP) ............... JP2019-127514

(51) Int. Cl.
*B23K 26/08* (2014.01)
*B23K 26/06* (2014.01)
(Continued)

(52) U.S. Cl.
CPC ...... *B23K 26/0876* (2013.01); *B23K 26/0648* (2013.01); *B23K 26/0665* (2013.01);
(Continued)

(58) Field of Classification Search
CPC ............ B23K 26/0876; B23K 26/0648; B23K 26/0665; B23K 26/0853; B23K 26/364; B23K 26/50; B23K 2103/56; B23K 26/046; B23K 26/53; B23K 26/02; B23K 26/702; B23K 26/0869; B23K 2101/40; H01L 21/67092; H01L 21/67115; H01L 21/6836; H01L 21/268; H01L 21/78; H01L 2221/68327; H01L 21/687; H01L 21/68714; H01L 21/68721; H01L 21/68728; H01L 2221/68309
See application file for complete search history.

(56) References Cited

U.S. PATENT DOCUMENTS 7,244,938 B2 * 7/2007 Nagai ................ B23K 26/53
250/341.4
10,468,255 B2 * 11/2019 Zhao ................ H01L 21/67132
(Continued)

FOREIGN PATENT DOCUMENTS

JP 2010048715 A 3/2010
JP 2011143488 A 7/2011
(Continued)

*Primary Examiner* — John P. Dulka
(74) *Attorney, Agent, or Firm* — Greer Burns & Crain Ltd.

(57) ABSTRACT

A calculating section of a control unit calculates a vertical position Defocus for a condensing lens using a height value H1 of a modified layer in a wafer that is set by a setting section according to the equation (1) below.

Defocus=(thickness $T1$ of wafer−height value $H1-b$)/a (1)

The calculating section calculates an appropriate vertical position for the condensing lens according to the equation (1) depending on the height value H1 of the modified layer that is set by the setting section. Therefore, the vertical position of the condensing lens in laser processing operation can be determined more easily, and a time-consuming and tedious experiment for fine adjustment of the vertical position of the condensing lens does not need to be conducted.

2 Claims, 6 Drawing Sheets

(51) Int. Cl.
*B23K 26/364* (2014.01)
*B23K 26/50* (2014.01)
*H01L 21/67* (2006.01)
*H01L 21/683* (2006.01)
*H01L 21/78* (2006.01)
*B23K 103/00* (2006.01)
*H01L 21/268* (2006.01)

(52) U.S. Cl.
CPC ........ *B23K 26/0853* (2013.01); *B23K 26/364* (2015.10); *B23K 26/50* (2015.10); *H01L 21/67092* (2013.01); *H01L 21/67115* (2013.01); *H01L 21/6836* (2013.01); *B23K 2103/56* (2018.08); *H01L 21/268* (2013.01); *H01L 21/78* (2013.01); *H01L 2221/68327* (2013.01)

(56) References Cited

U.S. PATENT DOCUMENTS

| | | | | |
|---|---|---|---|---|
| 11,211,296 | B2* | 12/2021 | Kawano | B23K 26/0006 |
| 2004/0037206 | A1* | 2/2004 | Shinoda | G02B 7/027 |
| 2005/0180293 | A1* | 8/2005 | Ueyama | G11B 7/1353 |
| | | | | 369/44.37 |
| 2006/0076327 | A1* | 4/2006 | Kobayashi | B23K 26/40 |
| | | | | 219/121.73 |
| 2008/0055588 | A1* | 3/2008 | Nomaru | B23K 26/034 |
| | | | | 356/73 |
| 2009/0266802 | A1* | 10/2009 | Sawabe | B23K 26/0853 |
| | | | | 219/121.78 |
| 2010/0044359 | A1* | 2/2010 | Sawabe | B23K 26/03 |
| | | | | 219/121.83 |
| 2012/0312793 | A1* | 12/2012 | Nomaru | B23K 26/0006 |
| | | | | 219/121.78 |
| 2013/0183811 | A1* | 7/2013 | Kobayashi | B24B 7/228 |
| | | | | 438/463 |
| 2014/0152796 | A1* | 6/2014 | Mitsuhiro | G02B 21/0016 |
| | | | | 348/79 |
| 2014/0322847 | A1* | 10/2014 | Endo | B23K 26/40 |
| | | | | 438/33 |
| 2015/0332910 | A1* | 11/2015 | Morikazu | H01L 21/02013 |
| | | | | 438/798 |
| 2016/0372349 | A1* | 12/2016 | Hyakumura | B23K 26/032 |
| 2017/0103921 | A1* | 4/2017 | Shotokuji | H01L 33/62 |
| 2017/0197277 | A1* | 7/2017 | Hirata | B23K 26/032 |
| 2018/0304409 | A1* | 10/2018 | Nakamura | B23K 37/0408 |
| 2018/0350651 | A1* | 12/2018 | Zhao | H01L 21/78 |
| 2019/0033232 | A1* | 1/2019 | Ahn | H01J 37/263 |
| 2020/0306877 | A1* | 10/2020 | Ueki | B23K 26/048 |
| 2020/0384571 | A1* | 12/2020 | Miura | B23K 26/702 |
| 2021/0008661 | A1* | 1/2021 | Ueki | H01L 21/68714 |
| 2021/0028071 | A1* | 1/2021 | Kawano | B23K 26/0853 |
| 2021/0031307 | A1* | 2/2021 | Nakamura | B23K 26/08 |
| 2021/0094128 | A1* | 4/2021 | Nomaru | B23K 26/046 |
| 2021/0183714 | A1* | 6/2021 | Ueki | G02B 27/0944 |

FOREIGN PATENT DOCUMENTS

| | | |
|---|---|---|
| JP | 2011151299 A | 8/2011 |
| JP | 2018063148 A | 4/2018 |

* cited by examiner

LASER PROCESSING APPARATUS WITH CALCULATING SECTION

BACKGROUND OF THE INVENTION

Field of the Invention

The present invention relates to a laser processing apparatus.

Description of the Related Art

There has been a laser processing method by which a laser beam having a wavelength that is transmittable through a plate-shaped workpiece is applied to an upper surface of the workpiece, with its focused point positioned in the workpiece, and the focused point is moved along projected dicing lines on the workpiece to form modified layers in the workpiece. The laser processing method has posed demands on efforts to position the focused point at a constant height from the lower surface of the workpiece.

To meet the demands, before the workpiece is processed by the laser beam, the thickness of the workpiece is measured and the height of a condensing lens for the laser beam is determined for forming modified layers in the workpiece depending on the measured thickness. Details of measurement of workpiece thicknesses are disclosed in Japanese Patent Laid-open No. 2011-143488, Japanese Patent Laid-open No. 2011-151299, Japanese Patent Laid-open No. 2018-063148, and Japanese Patent Laid-open No. 2010-048715.

SUMMARY OF THE INVENTION

In case a workpiece is made of silicon, since the ratio of the refractive index of silicon to the refractive index of air is approximately 4, or actually 3.7 to be more precise, it is known that the focused point of a laser beam that has traveled through a condensing lens moves in the workpiece by a distance that is approximately four times the distance that the condensing lens moves.

For forming modified layers in the workpiece, therefore, the distance from the upper surface of the workpiece to a position where the modified layers are to be formed is determined at first. Then, the condensing lens is brought closer to the workpiece by one quarter of the determined distance from the position where the focused point is to be placed on the upper surface of the workpiece. In this state, the laser beam is applied to the workpiece to form modified layers in the workpiece. According to the above conventional process, however, if the thickness of the workpiece has slight variations, then the formed modified layers tend to have their vertical position shifted vertically.

The above conventional process is premised on the fact that when the condensing lens moves, the focused point of the laser beam moves in the workpiece by a distance that is approximately four times the distance that the condensing lens moves because of the refractive index of the workpiece. However, the focused point may not necessarily move by a distance that is approximately four times the distance that the condensing lens moves. According to the conventional process, an experiment is conducted to form modified layers in a workpiece, and the position of a condensing lens is finely adjusted on the basis of the result of the experiment. Therefore, it requires some expenditure of time to be able to form modified layers in a workpiece at a predetermined height from the lower surface of the workpiece.

It is therefore an object of the present invention to provide a laser processing apparatus that is capable of calculating an appropriate vertical position for a condensing lens depending on the position where modified layers are to be formed in a workpiece, i.e., a vertical position from the lower surface of the workpiece, after the vertical position has been set.

In accordance with an aspect of the present invention, there is provided a laser processing apparatus including a processing unit for positioning a focused point of a laser beam that is transmittable through a workpiece and that is focused by a condensing lens, within the workpiece to cause the focused point to form a modified layer within the workpiece, a chuck table having a holding surface for holding the workpiece thereon, a processing feed unit for processing-feeding the chuck table and the processing unit relatively to each other in a direction parallel to the holding surface, lifting and lowering means for moving the condensing lens in a direction perpendicular to the holding surface, and a control unit, in which the control unit includes a setting section for setting a height value from a lower surface of the workpiece at a predetermined vertical position from the lower surface of the workpiece in order to form the modified layer at the predetermined vertical position within the workpiece, and a calculating section for calculating a vertical position Defocus for the condensing lens according to the height value of the modified layer that is set by the setting section and the equation (1) below, $$\text{Defocus} = (\text{thickness of the workpiece} - \text{height value} - b)/a \quad (1)$$

where "a" and "b" represent constants, in which the calculating section positions the condensing lens at at least two points at different heights, forming at least two modified layers at different depths, while lowering the focused point of the condensing lens stepwise from an upper surface of the wafer, plots spots corresponding to the at least two modified layers in a coordinate system having a vertical axis representing distance Depth from the modified layer to the upper surface of the workpiece and a horizontal axis representing vertical positions Defocus of the condensing lens, the calculating section determines the constant "a" as the slope and the constant "b" as the intercept of a linear function indicated by the equation (2) below that represents an approximate straight line passing through the spots corresponding to modified layers, $$\text{Depth} = a \times \text{Defocus} + b \quad (2)$$

and applies the equation (2) to the equation (3) below about the distances Depth from the modified layers to the upper surface of the workpiece, thereby obtaining the above equation (1), $$\text{Depth} = \text{thickness of the workpiece} - \text{height value} \quad (3)$$

and the lifting and lowering means moves the condensing lens to the vertical position Defocus determined by the equation (1) to form a modified layer in the workpiece at the vertical position from the lower surface thereof that is set by the setting section.

Preferably, the calculating section changes the constants "a" and "b" to be used in the equation (1) depending on the distance Depth from the modified layer to the upper surface of the workpiece.

According to the present invention, the calculating section calculates an appropriate vertical position Defocus for the condensing lens according to the equation (1) depending on the height value of the modified layer that is set by the setting section. Consequently, it is not necessary to perform a two-stage adjustment process for roughly determining the vertical position of the condensing lens depending on the ratio of the refractive index of the wafer to the refractive index of air and thereafter finely adjusting the vertical position of the condensing lens depending on the result of an experiment conducted in advance. Therefore, the vertical position of the condensing lens in laser processing operation can be determined more easily, and a time-consuming and tedious experiment for fine adjustment of the vertical position of the condensing lens does not need to be conducted.

The calculating section may change the constants "a" and "b" to be used in the equation (1) depending on the distance Depth from the modified layer to the upper surface of the workpiece. Since the accuracy of the equation (1) is thus increased, the vertical position Defocus of the condensing lens can be calculated more accurately.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
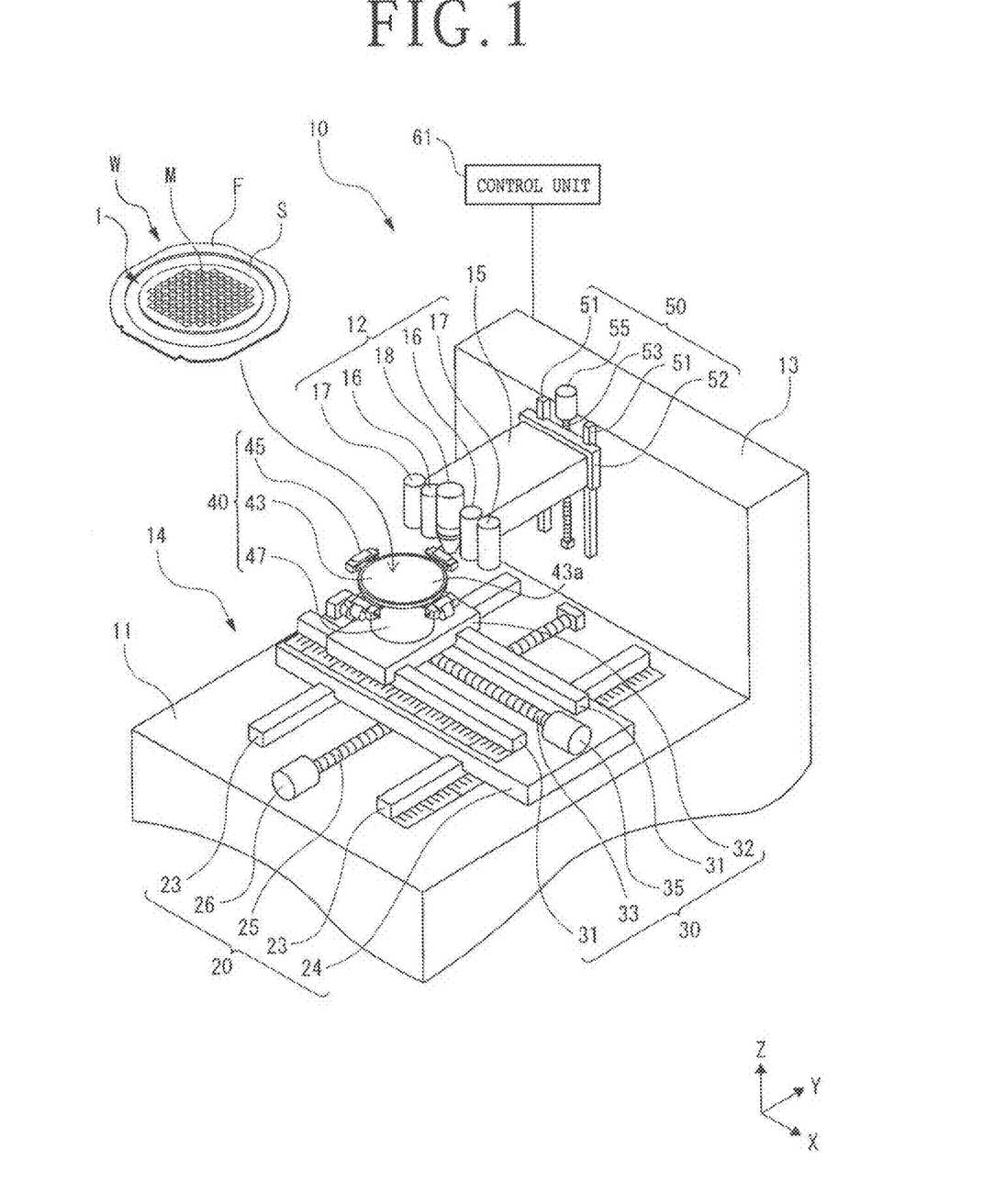
FIG. 1 is a perspective view of a laser processing apparatus according to an embodiment of the present invention.

As illustrated in FIG. 1, a laser processing apparatus 10 according to a preferred embodiment of the present invention includes a base 11 in the shape of a rectangular parallelepiped, an upstanding wall 13 erected on an end of the base 11, and a chuck table assembly 40 disposed on the base 11. The chuck table assembly 40 is used to hold thereon a wafer 1 that is of a generally circular shape. As illustrated in FIG. 1, the wafer 1, i.e., a workpiece to be processed by the laser processing apparatus 10, is incorporated in a workpiece unit W held by the chuck table assembly 40. The workpiece unit W includes a ring frame F, an adhesive tape S, and the wafer 1. The wafer 1 is supported on the ring frame F by the adhesive tape S. The wafer 1 has a grid of projected dicing lines M on a face side thereof that demarcate the face side into a plurality of areas with respective devices, not illustrated, formed therein. The wafer 1 will be divided along the projected dicing lines M into individual device chips including the respective devices.

The chuck table assembly 40 has a chuck table 43 as holding means having a holding surface 43a for holding the wafer 1 thereon, a plurality of, i.e., four in FIG. 1, clamps 45 disposed around the chuck table 43 for clamping the ring frame F, and a θ table 47 supporting the chuck table 43 thereon. The θ table 47 is rotatably mounted on an upper surface of an X-axis table 32 for rotation about its own central axis in an XY horizontal plane. The chuck table 43 is shaped as a circular plate and disposed above the θ table 47.

The holding surface 43a, which is provided as an upper surface of the chuck table 43, is made of porous ceramics for holding the wafer 1 thereon under suction. The holding surface 43a is held in fluid communication with a suction source, not illustrated. The four clamps 45 are disposed around the chuck table 43 at angularly spaced positions and include respective support arms mounted on the chuck table 43. When the four clamps 45 are actuated by an air actuator, not illustrated, they grip and clamp corresponding four angularly spaced regions of the ring frame F disposed around the wafer 1 held on the chuck table 43.

The upstanding wall 13 of the laser processing apparatus 10 is erected behind the chuck table assembly 40. A vertically movable assembly 50 for moving the laser unit 12 that includes a condensing lens to be described later in Z-axis directions is mounted on a front surface of the upstanding wall 13. The vertically movable assembly 50 includes a pair of guide rails 51 extending in the Z-axis directions, a Z-axis table 52 movably mounted on the guide rails 51, a ball screw 53 extending parallel to and disposed between the guide rails 51, and a drive motor 55 for rotating the ball screw 53 about its own axis.

The guide rails 51 are disposed on the front surface of the upstanding wall 13 and extend parallel to the Z-axis directions. The Z-axis table 52 is slidably disposed on the guide rails 51 for sliding movement along the guide rails 51. An arm 15 and the laser unit 12 are mounted on the Z-axis table 52.

The ball screw 53 is threaded through a nut, not illustrated, mounted on a rear surface of the Z-axis table 52. The drive motor 55 is coupled to an end of the ball screw 53 and, when energized, rotates the ball screw 53 about its own axis. When the ball screw 53 is rotated about its own axis, the Z-axis table 52, the arm 15, and the laser unit 12 are moved in the Z-axis directions along the guide rails 51.

The arm 15 protrudes from the Z-axis table 52 in the direction of the chuck table assembly 40. The laser unit 12 is supported on a distal end of the arm 15 in confronting relation to the chuck table 43 of the chuck table assembly 40.

The laser unit 12 is a device for processing the wafer 1 with a laser beam. The laser unit 12 has a processing unit 18 for processing the wafer 1 held on the chuck table 43 with a laser beam, and a pair of thickness measuring means 16 and a pair of upper surface height measuring means 17 that belong to a pair of groups disposed one on each side of the processing unit 18.

Each of the thickness measuring means 16 measures the thickness of the wafer 1 held on the chuck table 43. Each of the upper surface height measuring means 17 measures the vertical position of the upper surface of the wafer 1 held on the chuck table 43. The height of the upper surface of the wafer 1 refers to the height from the upper surface of the X-axis table 32 or the base 11 up to the upper surface of the wafer 1.

The thickness measuring means 16 and the upper surface height measuring means 17 may be any of thickness measuring instruments and upper surface height measuring instruments disclosed in Japanese Patent Laid-Open No. 2011-143488, Japanese Patent Laid-Open No. 2011-151299, Japanese Patent Laid-Open No. 2018-063148, and Japanese Patent Laid-Open No. 2010-048715.

Figure 2:
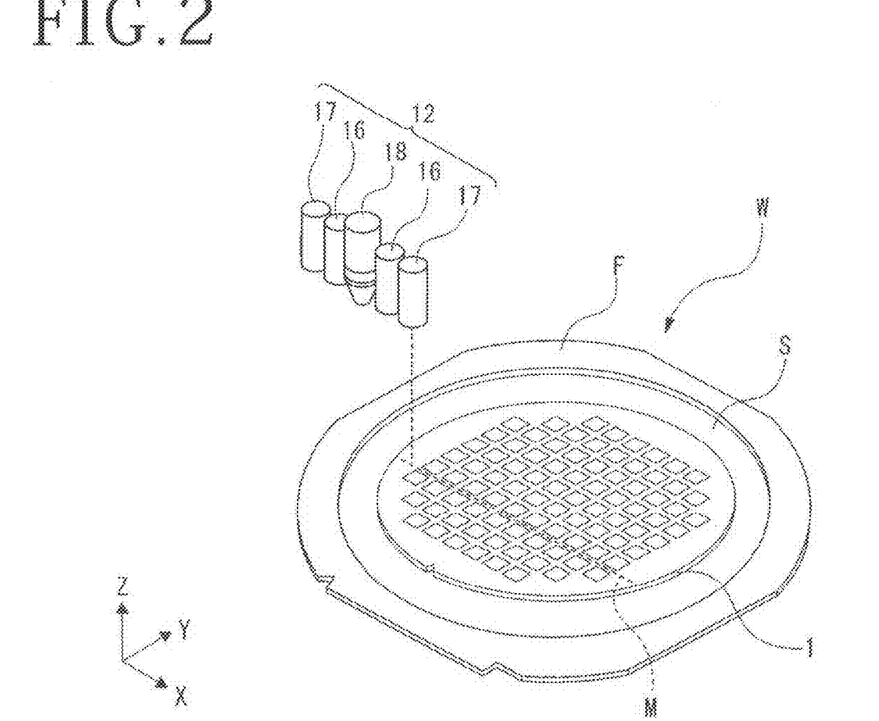
FIG. 2 is a perspective view illustrating projected dicing lines of a workpiece unit and a laser unit of the laser processing apparatus.
Figure 3:
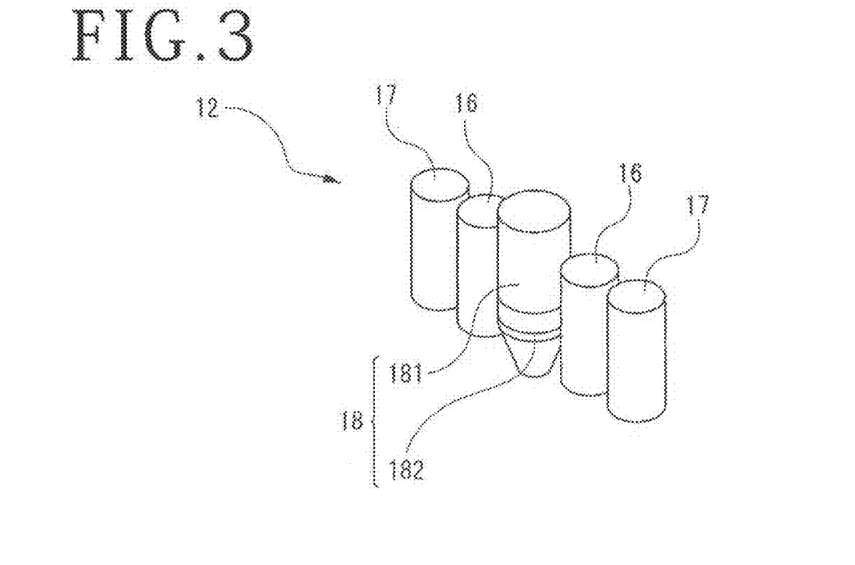
FIG. 3 is an enlarged perspective view of the laser unit.

As illustrated in FIG. 2, the laser unit 12 is moved relatively to the wafer 1 of the workpiece unit W along a single projected dicing line M thereon. As illustrated in FIG. 3, the processing unit 18 of the laser unit 12 includes a beam condenser 181 and an actuator 182.

The beam condenser 181 includes a laser oscillator and a condensing lens, and focuses a laser beam having a wavelength that is transmittable through the wafer 1 within the wafer 1 that is held on the chuck table 43. The actuator 182 adjusts the height of the beam condenser 181, i.e., the condensing lens thereof, with respect to the wafer 1 that is held on the chuck table 43. Specifically, the actuator 182 represents an example of lifting and lowering means for moving the beam condenser 181, i.e., the condensing lens thereof, in directions perpendicular to the holding surface 43a of the chuck table 43. The processing unit 18 thus constructed positions a focused point of the laser beam that has been focused by the condensing lens within the wafer 1 and forms a modified layer in the wafer 1 with the focused point of the laser beam.

As illustrated in FIG. 1, a chuck table moving mechanism 14 for moving the chuck table 43 is disposed on an upper surface of the base 11. The chuck table moving mechanism 14 includes an indexing feed unit 20 for moving the chuck table 43 in an indexing feed direction and a processing feed unit 30 for moving the chuck table 43 in a processing feed direction.

The indexing feed unit 20 includes a pair of guide rails 23 extending in Y-axis directions, a Y-axis table 24 movably mounted on the guide rails 23, a ball screw 25 extending parallel to and disposed between the guide rails 23, and a drive motor 26 for rotating the ball screw 25 about its own axis.

The guide rails 23 are disposed on the upper surface of the base 11 and extend parallel to the Y-axis directions. The Y-axis table 24 is slidably disposed on the guide rails 23 for sliding movement along the guide rails 23. The processing feed unit 30 and the chuck table assembly 40 are disposed on the Y-axis table 24.

The ball screw 25 is threaded through a nut, not illustrated, mounted on a lower surface of the Y-axis table 24. The drive motor 26 is coupled to an end of the ball screw 25 and, when energized, rotates the ball screw 25 about its own axis. When the ball screw 25 is rotated about its own axis, the Y-axis table 24, the processing feed unit 30, and the chuck table assembly 40 are moved in the indexing feed direction, i.e., one of the Y-axis directions, along the guide rails 23.

The processing feed unit 30 processing-feeds the chuck table 43 and the processing unit 18 relatively to each other in the X-axis directions parallel to the holding surface 43a of the chuck table 43. According to the present embodiment, the processing feed unit 30 processing-feeds the chuck table 43 in the X-axis directions.

The processing feed unit 30 includes a pair of guide rails 31 extending in X-axis directions, an X-axis table 32 movably mounted on the guide rails 31, a ball screw 33 extending parallel to and disposed between the guide rails 31, and a drive motor 35 for rotating the ball screw 33 about its own axis. The guide rails 31 are disposed on an upper surface of the Y-axis table 24 and extend parallel to the X-axis directions. The X-axis table 32 is slidably disposed on the guide rails 31 for sliding movement along the guide rails 31. The chuck table assembly 40 is disposed on the X-axis table 32.

The ball screw 33 is threaded through a nut, not illustrated, mounted on a lower surface of the X-axis table 32. The drive motor 35 is coupled to an end of the ball screw 33 and, when energized, rotates the ball screw 33 about its own axis. When the ball screw 33 is rotated about its own axis, the X-axis table 32 and the chuck table assembly 40 are moved in the processing feed direction, i.e., one of the X-axis directions, along the guide rails 31. The laser processing apparatus 10 also includes a control unit 61 for controlling the components thereof.

Figure 4:
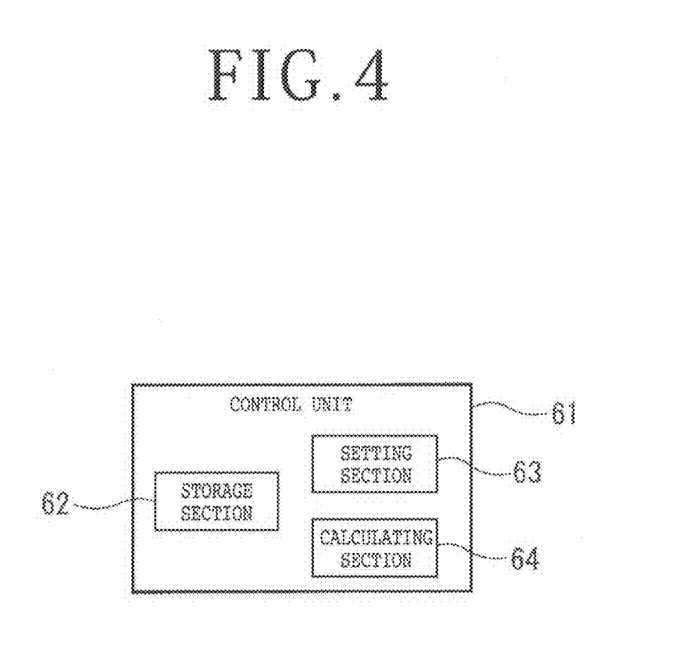
FIG. 4 is a block diagram of a control unit of the laser processing apparatus.

As illustrated in FIG. 4, the control unit 61 includes a storage section 62 for storing various programs and data, a setting section 63 for setting a position where a modified layer is to be formed in the wafer 1, and a calculating section 64 for calculating the vertical position of the condensing lens of the beam condenser 181.

Operation of the laser processing apparatus 10 for processing the wafer 1 with a laser beam will be described below. In the laser processing apparatus 10, under the control of the control unit 61, the focused point of the laser beam transmittable through the wafer 1 is positioned within the wafer 1 and relatively processing-fed with respect to the wafer 1 along the projected dicing line M, thereby forming a modified layer within the wafer 1.

More specifically, the operator places the wafer 1 on the chuck table 43 of the chuck table assembly 40. The control unit 61 brings the holding surface 43a of the chuck table 43 into fluid communication with the suction source, causing the holding surface 43a to hold the wafer 1 under suction. The control unit 61 also controls the clamps 45 to grip and clamp the ring frame F disposed around the wafer 1.

Then, as illustrated in FIG. 2, the control unit 61 applies the laser beam to the wafer 1 along the projected dicing line M while moving the laser unit 12 relatively to the wafer 1, thereby processing the wafer 1 with the laser beam.

Specifically, the control unit 61 controls the indexing feed unit 20 and the chuck table assembly 40 illustrated in FIG. 1 to make the projected dicing line M on the wafer 1 parallel to the X-axis directions and place an end of the projected dicing line M directly beneath the laser unit 12, i.e., the thickness measuring means 16, the upper surface height measuring means 17, and the processing unit 18 according to an alignment process. The wafer 1 will be processed by the laser beam along the projected dicing line M.

After the alignment process, the control unit 61 controls the processing feed unit 30 to processing-feed the wafer 1 held on the chuck table 43 along the X-axis directions. As a result, the laser unit 12 is moved relatively to the wafer 1 in one of the X-axis directions, e.g., a +X-axis direction (see FIGS. 5A and 5B).

Figure 5A:
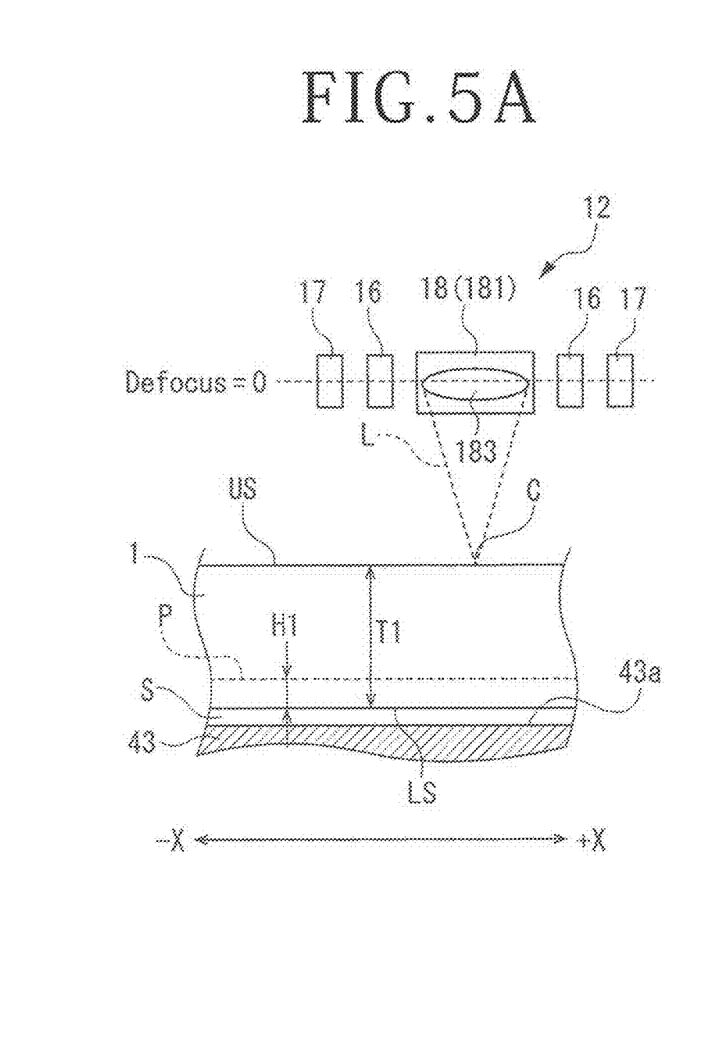
FIGS. 5A and 5B are schematic views illustrating the manner in which the laser beam processing apparatus operates to process a workpiece with a laser beam emitted from the laser unit.

At this time, the control unit 61 controls the vertical position, of the beam condenser 181, i.e., the condensing lens, denoted by 183, thereof, of the processing unit 18, as illustrated in FIG. 5A. In this controlling operation of the control unit 16, the setting section 63 of the control unit 61 illustrated in FIG. 4 sets, as illustrated in FIG. 5A, a height value H1 from a lower surface LS of the wafer 1 up to a vertical position P from the lower surface LS in the wafer 1 in order to form a modified layer at the vertical position P. The setting section 63 sets the height value H1 according to a value indicated by the operator.

Furthermore, the calculating section 64 of the control unit 61 calculates an appropriate vertical position, i.e., Defocus, of the condensing lens 183 according to the following equation (1):

$$\text{Defocus} = (\text{thickness } T1 \text{ of wafer 1} - \text{height value } H1 - b)/a \quad (1)$$

where "a" and "b" represent constants.

Figure 5B:
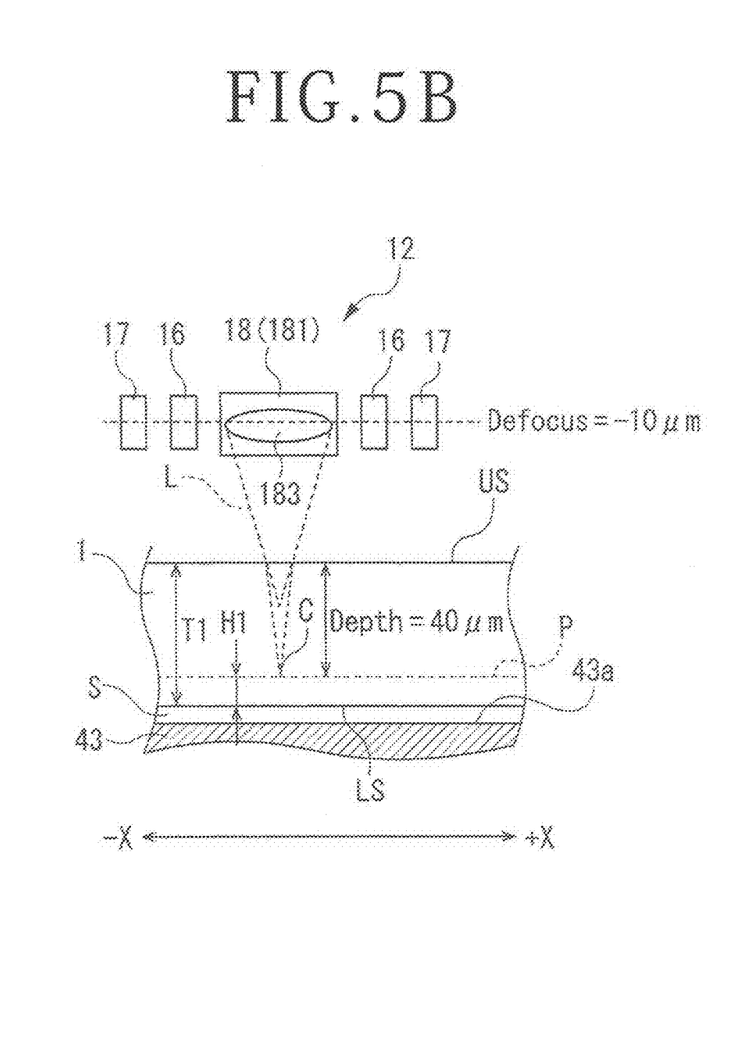

In examples illustrated in FIGS. 5A and 5B, the vertical position Defocus of the condensing lens 183 represents a position in which the condensing lens 183 places the focused point, denoted by C, of an applied laser beam L on an upper surface US of the wafer 1, the position being referred to as a reference position where Defocus=0, for example. When a modified layer is formed in the wafer 1, the focused point C is placed within the wafer 1, and hence the vertical position Defocus of the condensing lens 183 is lower than the reference position and is of a negative value (see FIG. 5B).

In the example illustrated in FIGS. 5A and 5B, in case the wafer 1 is made of silicon, since the ratio of the refractive index of silicon to the refractive index of air is approximately 4, the focused point C is placed at a position in the wafer 1 that is approximately four times the distance that the condensing lens 183 moves from the reference position Defocus=0. For example, when the vertical position of the condensing lens 183 is lowered by 10 μm (Defocus=−10 μm), the position of the focused point C, i.e., the position where a modified layer is formed, is lowered by approximately 40 μm. Therefore, as illustrated in FIG. 5B, a modified layer is formed by the focused point C at a depth of approximately 40 μm, which represents the distance from the upper surface US of the wafer 1 to the modified layers, indicated by Depth in FIG. 5B.

The value of the thickness T1 of the wafer 1 in the equation (1) may be measured by the thickness measuring means 16 illustrated in FIG. 1 or may manually be entered and stored in the storage section 62 in advance by the operator.

The control unit 61 then controls the actuator 182 (see FIG. 3) to move the beam condenser 181 to the vertical position calculated by the calculating section 64. Now, the focused point C is placed at the vertical position P corresponding to the height value H1, set by the setting section 63, from the lower surface LS of the wafer 1, for forming a modified layer at the vertical position P in the wafer 1.

The derivation of the above equation (1) will be described below. According to the present embodiment, the calculating section 64 of the control unit 61 carries out a calculating equation deriving step for deriving the constants "a" and "b" in the equation (1) as a preparatory step for the laser processing operation.

In the calculating equation deriving step, the calculating section 64 places the laser unit 12 including the processing unit 18, i.e., the condensing lens 183, over the wafer 1 while a test wafer 1, for example, is being held on the chuck table 43.

Then, while lowering the focused point C of the condensing lens 183 stepwise from the upper surface US of the wafer 1, the calculating section 64 positions the condensing lens 183 at at least two points at different heights, forming at least two modified layers at different depths indicated by Depth in FIG. 5B.

Thereafter, the calculating section 64 obtains measured depths Depth of the modified layers thus formed. Then, the calculating section 64 plots spots, i.e., measured spots, corresponding to the at least two formed modified layers in a coordinate system having a vertical axis representing depths Depth and a horizontal axis representing vertical positions Defocus of the condensing lens 183. In other words, the calculating section 64 plots in the coordinate system the measured depths Depth of the modified layers which correspond to the vertical positions Defocus of the condensing lens 183 at the time the modified layers are formed. In this manner, the calculating section 64 acquires a graph representing the relationship between the vertical positions Defocus of the condensing lens 183 and the measured depths Depth of the modified layers.

The calculating section 64 then determines the constant "a" as the slope and the constant "b" as the intercept of a linear function indicated by the equation (2) below that represents an approximate straight line passing through the spots corresponding to the modified layers. These constants "a" and "b" represent values depending on the material, i.e., refractive index, of the material of the wafer 1 and the depths Depth of the formed modified layers.

$$\text{Depth} = a \times \text{Defocus} + b \quad (2)$$

Moreover, the calculating section 64 applies the equation (2) to the equation (3) below about the depths Depth of the modified layers, thereby obtaining the above equation (1).

$$\text{Depth} = \text{thickness of wafer 1} - \text{height value } H1 \quad (3)$$

Figure 6:
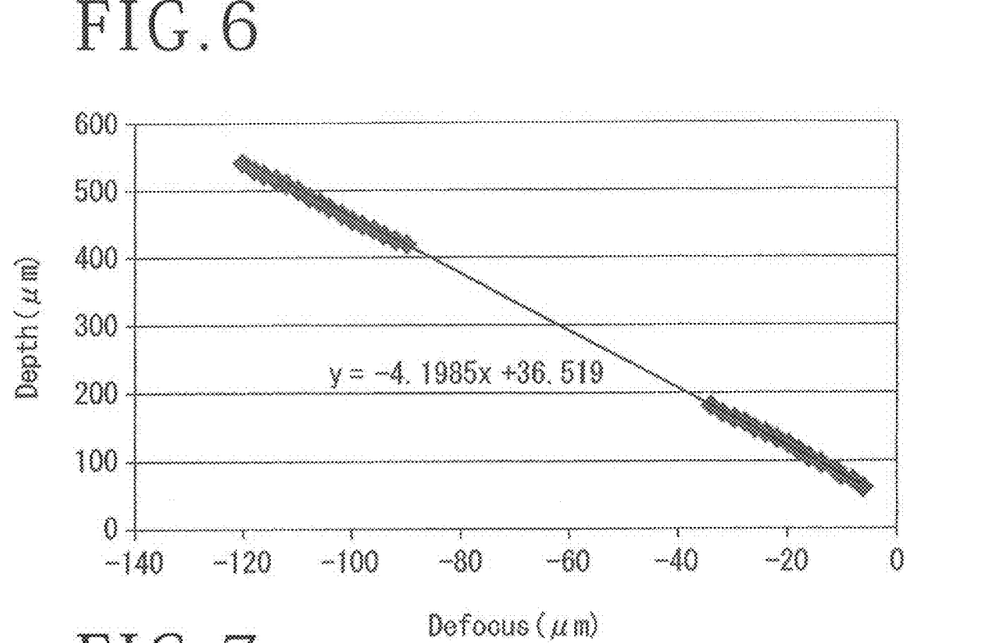
FIG. 6 is a graph illustrating the relationship between vertical positions, indicated by Defocus, of a condensing lens and depths, indicated by Depth, of modified layers.

An example in which the equation (1) is derived will be described below. In this example, as illustrated in FIG. 6, the calculating section 64 changes the vertical position Defocus of the condensing lens 183 from the reference position to 15 locations in a first range of −6 to −34 μm and to 16 locations in a second range of −90 to −120 μm, forming modified layers at 31 locations in a wafer 1, and plots measured points representing the depths Depth of the respective modified layers in the coordinate system referred to above. The wafer 1 in this example has a thickness of 700 μm.

Then, the calculating section 64 obtains the equation (2a) below as the linear function indicated by the equation (2).

$$\text{Depth}(y) = -4.1985 \times \text{Defocus}(x) + 36.519 \quad (2a)$$

The calculating section 64 determines from the equation (2a) a constant "a"=−4.1985 as the gradient of the linear function and a constant "b"=36.519 as the intercept of the linear function. Then, the calculating section 64 obtains the equation (1a) corresponding to the above equation (1) with respect to this example.

$$\text{Defocus} = -(\text{thickness } T1 \text{ of wafer 1} - \text{height value } H1 - 36.519)/4.1985 \quad (1a)$$

In subsequent laser processing operation, the calculating section 64 calculates the vertical position Defocus of the condensing lens 183 based on the thickness (T1) of the wafer 1 and the height value (H1) set by the setting section 63 according to the equation (1a).

According to the present embodiment, as described above, the setting section 63 sets the height value H1 from the lower surface LS of the wafer 1 at the vertical position P in order to form a modified layer at the vertical position P. Then, the calculating section 64 calculates the vertical position Defocus of the condensing lens 183 using the height value H1 set by the setting section 63 according to the above equation (1).

According to the present embodiment, the calculating section 64 can thus calculates an appropriate vertical position for the condensing lens 183 depending on the height value for a modified layer that is set by the setting section 63. Consequently, it is not necessary to perform a two-stage adjustment process for roughly determining the vertical position of the condensing lens 183 depending on the ratio of the refractive index of the wafer 1 to the refractive index of air and thereafter finely adjusting the vertical position of the condensing lens 183 depending on the result of an experiment conducted in advance. Therefore, the vertical position of the condensing lens 183 in laser processing operation can be determined more easily, and a time-consuming and tedious experiment for fine adjustment of the vertical position of the condensing lens 183 does not need to be conducted.

The depth Depth of the formed modified layer differs depending on the thickness T1 of the wafer 1 though the height value H1 from the lower surface LS of the wafer 1 remains the same. In case the depth Depth of the formed modified layer differs, the constants "a" and "b" to be used in the equation (1) may differ even if the material of the wafer 1 is the same.

Figure 7:
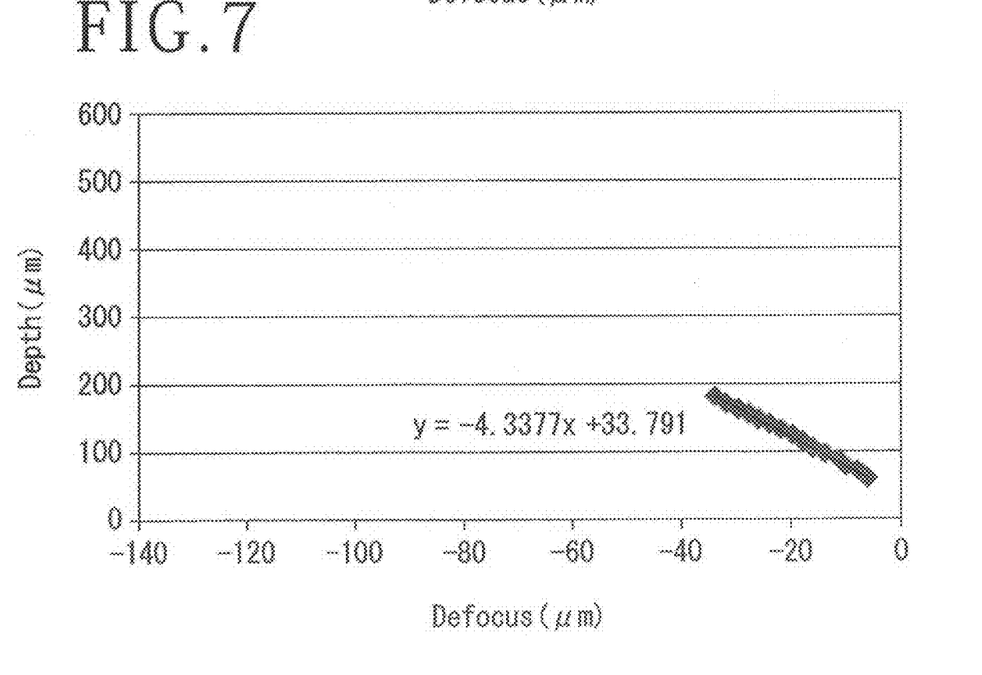
FIG. 7 is a graph illustrating only a first range of vertical positions, i.e., Defocus=−6 to −34 μm, in the graph illustrated in FIG. 6.

For example, the above equation (2) with respect to only the first range of Defocus=−6 to −34 μm, i.e., only shallow positions in the wafer 1, in the graph illustrated in FIG. 6 becomes the equation (2b) below as illustrated in FIG. 7, and the constants "a" and "b" are a=−4.3377 and b=33.791, respectively.

$$\text{Depth}(y)=-4.3377\times \text{Defocus}(x)+33.791 \qquad (2b)$$

Figure 8:
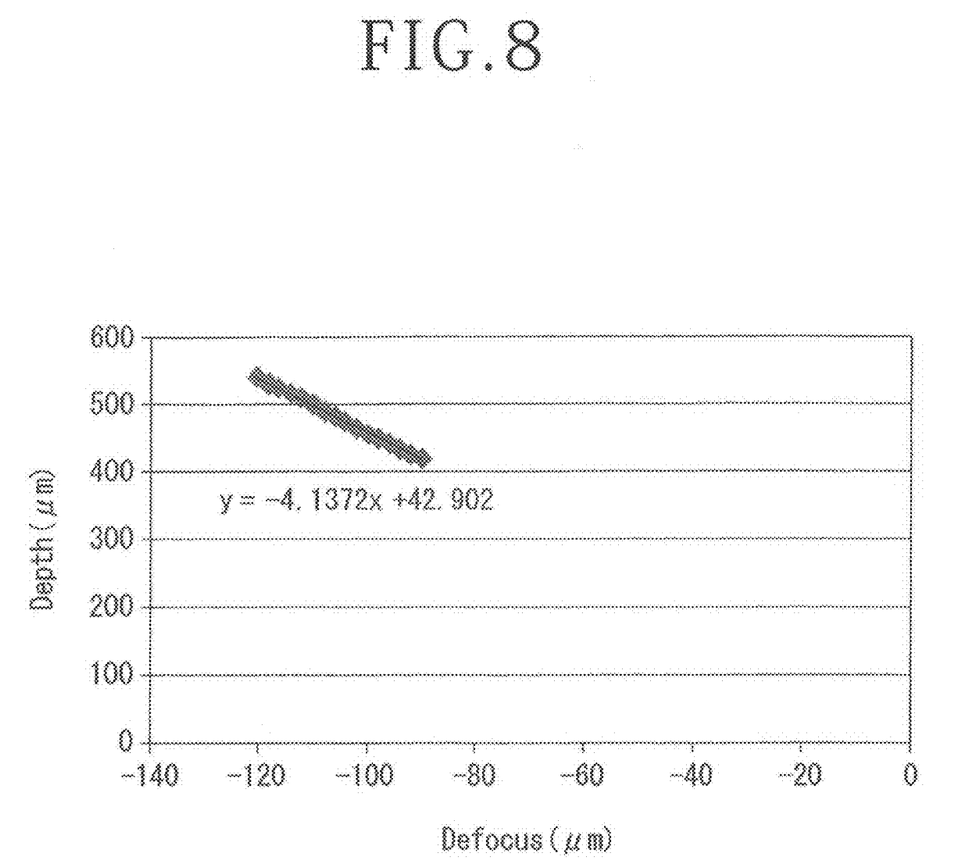
FIG. 8 is a graph illustrating only a second range of vertical positions, i.e., Defocus=−90 to −120 μm, in the graph illustrated in FIG. 6.

On the other hand, the above equation (2) with respect to only the second range of Defocus=−90 to −120 μm, i.e., only deep positions in the wafer 1, in the graph illustrated in FIG. 6 becomes the equation (2c) below as illustrated in FIG. 8, and the constants "a" and "b" are a=−4.1372 and b=42.902, respectively.

$$\text{Depth}(y)=-4.1372\times \text{Defocus}(x)+42.902 \qquad (2c)$$

The calculating section 64 may acquire beforehand a plurality of kinds of constants "a" and "b" depending on the depth Depth of the modified layer. The calculating section 64 may then change the constants "a" and "b" to be used in the equation (1) depending on the depth Depth of the modified layer, i.e., the height value H1 of the modified layer set by the setting section 63 and the thickness T1 of the wafer 1. Since the accuracy of the equation (1) is thus increased, the vertical position Defocus of the condensing lens 183 can be calculated more accurately.

Furthermore, while a wafer 1 is being processed, the thickness T1 of the wafer 1 and/or the height of the holding surface 43*a* of the chuck table 43 may vary due to a change in the position of the wafer 1 beneath the processing unit 18 in the processing feed direction. In such a case, the control unit 61 may control the thickness measuring means 16 and the upper surface height measuring means 17 to measure the thickness T1 of the wafer 1 and/or the height of the upper surface US of the wafer 1, and may finely adjust the vertical position Defocus of the condensing lens 183 depending on the measured values.

In the laser processing apparatus 10 illustrated in FIG. 1, the laser unit 12 includes the pair of thickness measuring means 16 and the pair of upper surface height measuring means 17. However, the laser unit 12 may include single thickness measuring means 16 and single upper surface height measuring means 17.

In the laser processing apparatus 10 illustrated in FIG. 1, moreover, the thickness measuring means 16 and the upper surface height measuring means 17 are provided as separate components. However, the laser unit 12 is not limited to such details, but may include, instead of the thickness measuring means 16 and the upper surface height measuring means 17, a single component having the same functions as the thickness measuring means 16 and the upper surface height measuring means 17, i.e., capable of measuring the thickness of the wafer 1 and the height of the upper surface of the wafer 1.

In case the calculating section 64 uses a value stored in the storage section 62 as the thickness T1 of the wafer 1, the laser processing apparatus 10 may be dispensed with the thickness measuring means 16. Moreover, in case while a wafer 1 is being processed, the thickness T1 of the wafer 1 and/or the height of the holding surface 43*a* of the chuck table 43 varies to a small extent due to a change in the position of the wafer 1 beneath the processing unit 18 in the processing feed direction, the laser processing apparatus 10 may be dispensed with the thickness measuring means 16 and the upper surface height measuring means 17.

In the example of the calculating equation deriving step illustrated in FIG. 6, the calculating section 64 forms modified layers at 31 locations in the two ranges of different depths Depth in order to derive the equation (1). In this regard, in the calculating equation deriving step, while lowering the focused point C of the condensing lens 183 stepwise from the upper surface US of the wafer 1, the calculating section 64 may position the condensing lens 183 at at least two points at different heights, forming at least two modified layers at different depths in the wafer 1.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a processing unit for positioning a focused point of a laser beam that is transmittable through a workpiece and that is focused by a condensing lens, within the workpiece to cause the focused point to form a modified layer within the workpiece;
a chuck table having a holding surface for holding the workpiece thereon;
a processing feed unit for processing-feeding the chuck table and the processing unit relatively to each other in a direction parallel to the holding surface;
lifting and lowering means for moving the condensing lens in a direction perpendicular to the holding surface; and
a control unit, wherein
the control unit includes
a setting section for setting a height value from a lower surface of the workpiece at a predetermined vertical position from the lower surface of the workpiece in order to form the modified layer at the predetermined vertical position within the workpiece, and
a calculating section for calculating a vertical position Defocus for the condensing lens according to the height value of the modified layer that is set by the setting section and the equation (1) below, Defocus=(thickness of the workpiece−height value−b)/a     (1)

where "a" and "b" represent constants, and
the calculating section
positions the condensing lens at at least two points at different heights, forming at least two modified layers at different depths, while lowering the focused point of the condensing lens stepwise from an upper surface of the wafer,
plots spots corresponding to the at least two modified layers in a coordinate system having a vertical axis representing distance Depth from the modified layer to the upper surface of the workpiece and a horizontal axis representing vertical positions Defocus of the condensing lens, determines the constant "a" as the slope and the constant "b" as the intercept of a linear function indicated by the equation (2) below that represents an approximate straight line passing through the spots corresponding to modified layers, $$\text{Depth} = a \times \text{Defocus} + b \quad (2),$$

and applies the equation (2) to the equation (3) below about the distances Depth from the modified layers to the upper surface of the workpiece, thereby obtaining the above equation (1), $$\text{Depth} = \text{thickness of the workpiece} - \text{height value} \quad (3),$$

and the lifting and lowering means moves the condensing lens to the vertical position Defocus determined by the equation (1) to form a modified layer in the workpiece at the vertical position from the lower surface thereof that is set by the setting section.

2. The laser processing apparatus according to claim 1, wherein the calculating section changes the constants "a" and "b" to be used in the equation (1) depending on the distance Depth from the modified layer to the upper surface of the workpiece.

* * * * *